(12) United States Patent
Matsumoto

(10) Patent No.: US 6,191,718 B1
(45) Date of Patent: Feb. 20, 2001

(54) DATA SAMPLING METHOD AND DEVICE

(75) Inventor: Mariko Matsumoto, Tokyo (JP)

(73) Assignee: NEC Corporaton, Tokyo (JP)

( * ) Notice: Under 35 U.S.C. 154(b), the term of this patent shall be extended for 0 days.

(21) Appl. No.: 09/342,444

(22) Filed: Jun. 29, 1999

(30) Foreign Application Priority Data

Jun. 30, 1998 (JP) .................................................. 10-183868

(51) Int. Cl.[7] .................................................. H03M 3/00
(52) U.S. Cl. ............................................ 341/143; 341/123
(58) Field of Search .................................... 341/123, 143; 700/74; 375/355

(56) References Cited

U.S. PATENT DOCUMENTS 5,408,235 * 4/1995 Doyle et al. ......................... 341/143
5,818,882 * 10/1998 Komatsu .............................. 375/344
5,963,160 * 10/1999 Wilson et al. ....................... 341/143

FOREIGN PATENT DOCUMENTS

| 6-313764 | 11/1994 | (JP) . |
| 8-4591 | 1/1996 | (JP) . |
| 9-83588 | 3/1997 | (JP) . |
| 9-135149 | 5/1997 | (JP) . |
| 9-321632 | 12/1997 | (JP) . |

* cited by examiner

Primary Examiner—Michael Tokar
Assistant Examiner—Anh Tran
(74) Attorney, Agent, or Firm—Scully, Scott, Murphy & Presser

(57) ABSTRACT

Digital data is generated by sampling an analog input signal at a sampling frequency that is N times an A/D sampling frequency that is necessary in an A/D converter. N decimated data strings are generated by decimating the digital data at a ratio of 1/N. Based on the N decimated data strings, a processor produces a digital output signal.

16 Claims, 5 Drawing Sheets

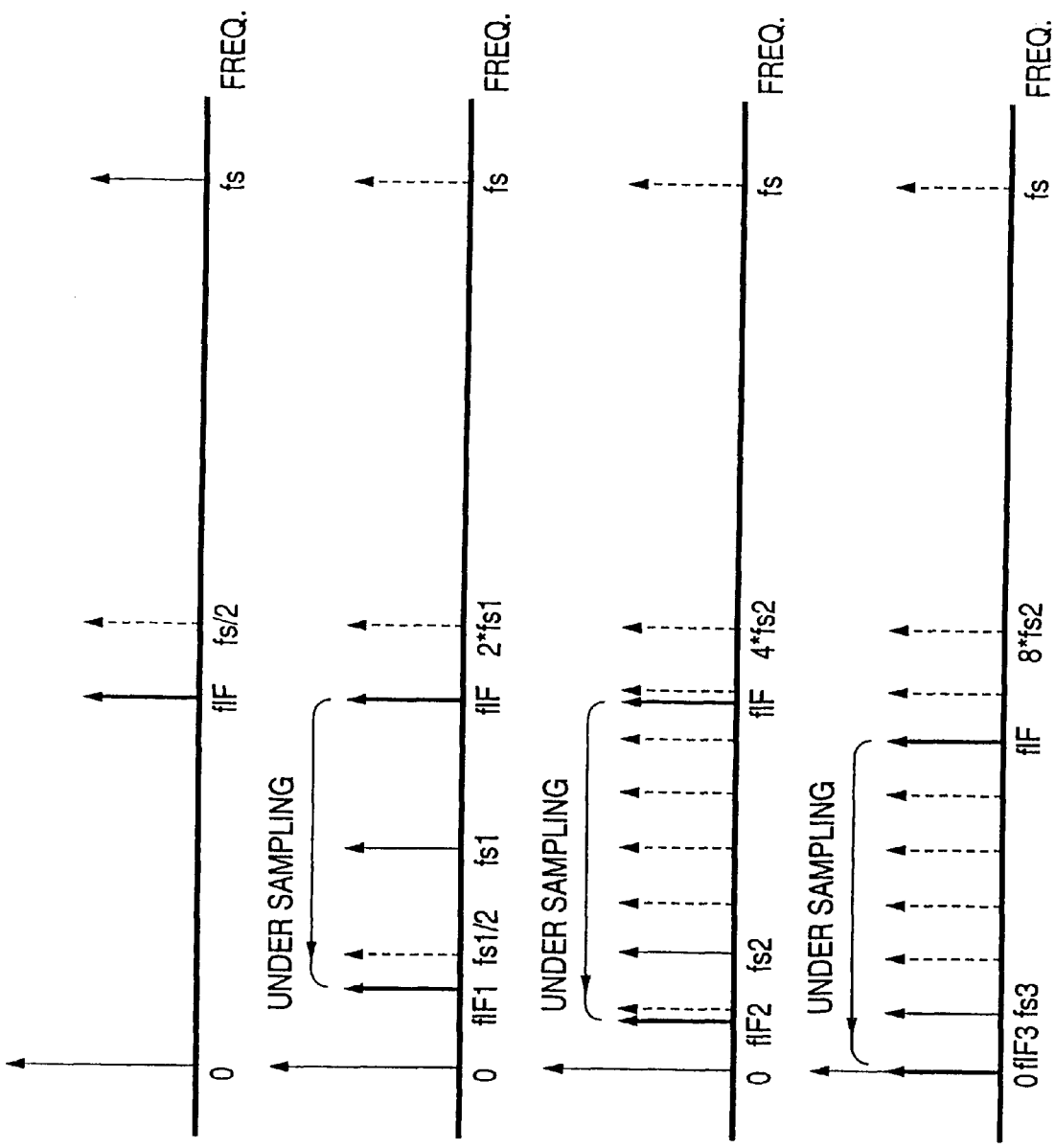

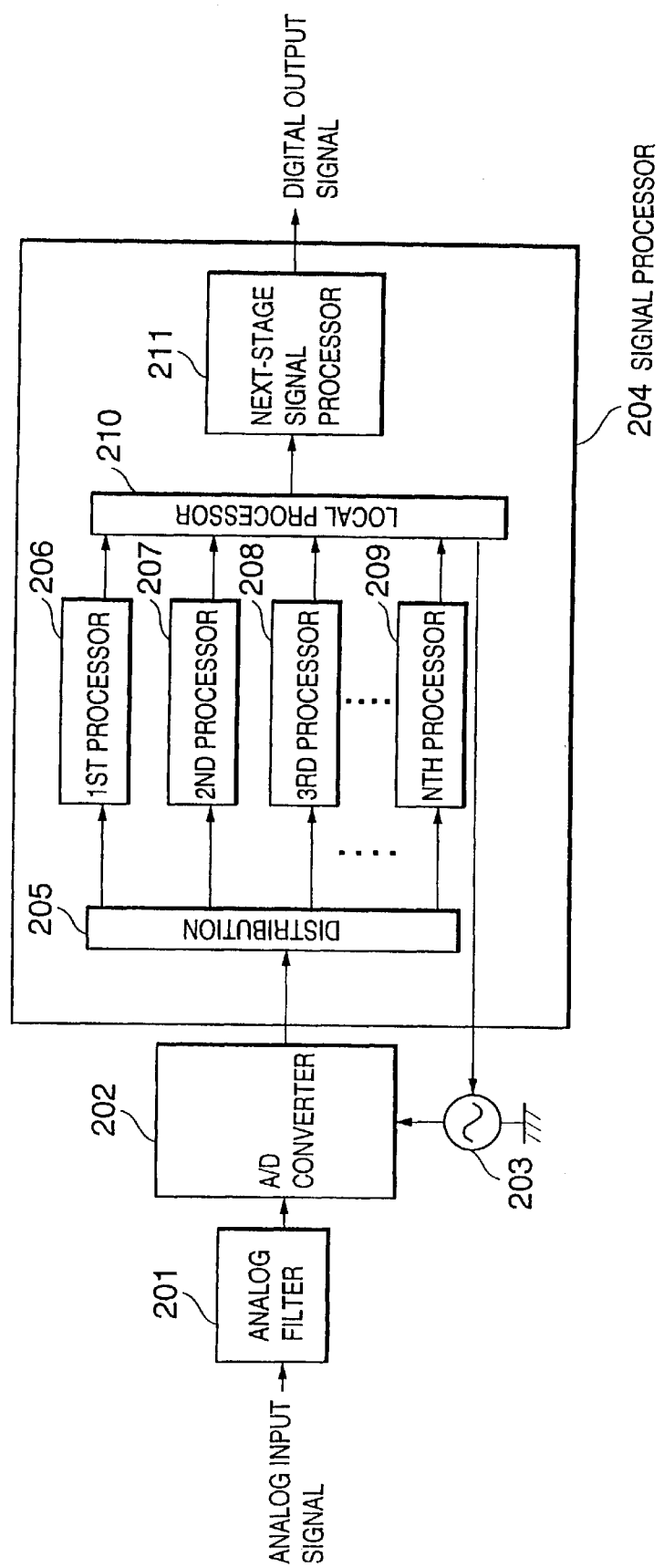

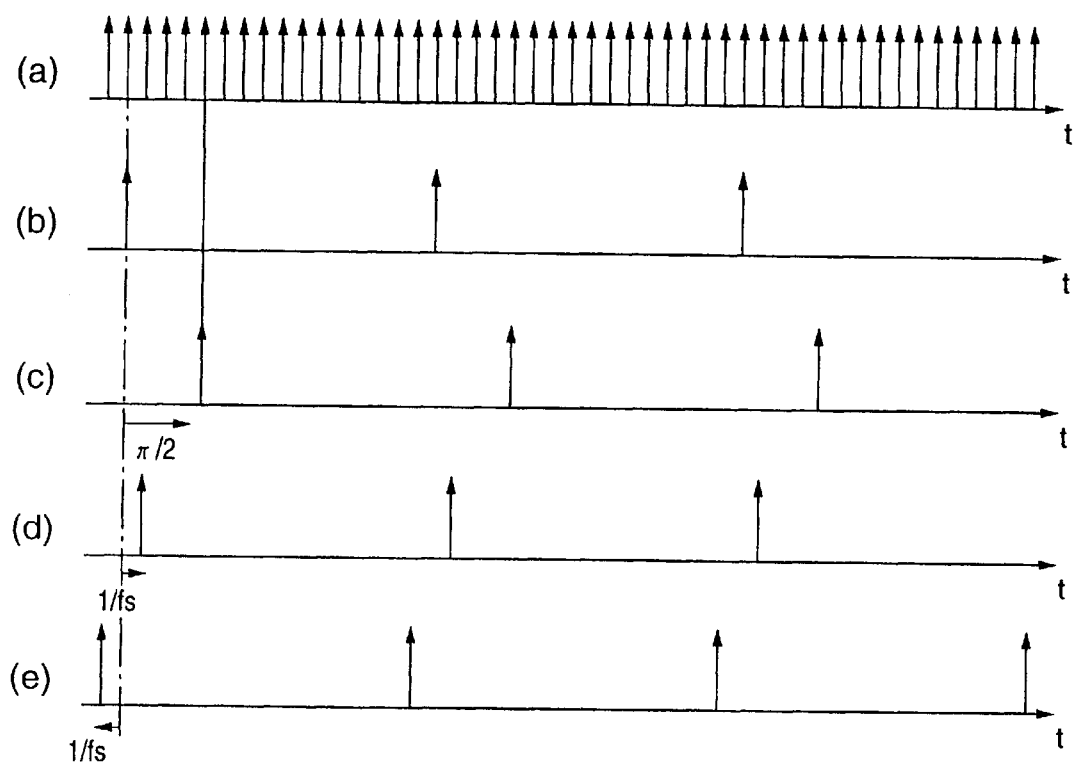

DATA SAMPLING METHOD AND DEVICE

BACKGROUND OF THE INVENTION

1. Field of the Invention

The present invention relates to an information signal processing technique and, more specifically, to a data sampling method and device for converting an analog input signal to a digital output signal by using an A/D (analog-to-digital) sampling frequency.

2. Description of the Prior Art

In recent years, the technology relating to mobile communication terminals has made great progress. As a result, mobile communication terminals having various communication functions such as a function of communicating various data including audio data, facsimile data, and personal computer (PC) data have been developed. To implement such communication functions, it is indispensable to incorporate, in a mobile communication terminal, an A/D conversion function for converting an analog signal to a digital signal. The A/D conversion is realized in such a manner that a digital signal is generated by sampling an analog signal according to an A/D sampling frequency. Techniques relating to this type of sampling are disclosed in Japanese Patent Application Laid-Open Nos. 6-313764, 9-83588, 9-135149, 9-321632, 8-4591, etc.

One problem that arises in incorporating various communication functions as described above in mobile communication terminals is that various data to be handled have different frequencies. As is well known, in mobile communication terminals, output signals should have the same frequency even if input signals have different frequencies. However, in the A/D conversion method in which a digital signal is generated by merely sampling an analog signal according to a sampling frequency, output signals have different frequencies when input signals have different frequencies. Although various A/D conversion techniques have been proposed to solve this problem, all of them are complex in configuration and hence are difficult to implement.

SUMMARY OF THE INVENTION

An object of the invention is therefore to provide a data sampling method and device which make it possible, with a simple configuration, to give a prescribed frequency to output signals even if input signals have different frequencies.

Another object of the invention is to provide a data sampling method and device which make it possible to perform delay adjustments on a data string digitally.

According to the present invention, a data sampling method for an A/D (analog-to-digital) conversion from an analog input signal to a digital output signal, includes the steps of: a) converting the analog input signal to digital data by sampling the analog input signal at a sampling frequency fs that is N times an A/D sampling frequency that is necessary for the A/D conversion, where N is an integer; b) decimating the digital data at a ratio of 1/N to produce N decimated data strings; and c) producing the digital output signal based on the N decimated data strings.

The sampling frequency fs may be adjusted based on the N decimated data strings. Preferably, a decimated data string is selected from the N decimated data strings by comparing data error rates thereof. The sampling frequency fs is adjusted depending on a deviation of a selected decimated data string from a predetermined data string of the N decimated data strings.

The step b) may comprise the steps of: b-1) generating N clock signals which have 1/N the sampling frequency fs and are delayed in order by 1/fs; and b-2) distributing the digital data using the N clock signals to produce the N decimated data strings.

A frequency of each of the N decimated data strings may be set to a baseband frequency so as to demodulating the analog input signal.

According to another aspect of the present invention, a data sampling method includes the steps of: a) converting the analog input signal to digital data by sampling the analog input signal at a sampling frequency fs that is N times an A/D sampling frequency that is necessary for the A/D conversion, where N is an integer and is determined depending on a frequency of the analog input signal; b) generating N clock signals which have 1/N the sampling frequency fs and are delayed in order by 1/fs; c) decimating the digital data using two clock signals selected from the N clock signals to produce two decimated data strings, wherein a frequency of each of the N decimated data strings is set to a baseband frequency and one of the two clock signals is delayed from the other by $\pi/2$; and d) combining the two decimated data strings to produce the digital output signal as a quadrature-demodulated signal.

BRIEF DESCRIPTION OF THE DRAWINGS

FIG. 1A is a frequency diagram showing a first example in which an analog input signal having a frequency fIF is sampled at a sampling frequency fs that satisfies the Nyquist condition;

FIG. 1B is a frequency diagram showing a second example in which the analog input signal is sampled at a sampling frequency fs and a decimated data string is generated by decimating resulting digital data at a decimation ratio of 1/4:

FIG. 1C is a frequency diagram showing a third example in which the analog input signal is sampled at a sampling frequency fs and a decimated data string is generated by decimating resulting digital data at a decimation ratio of 1/8;

FIG. 1D is a frequency diagram showing a fourth example in which the analog input signal is sampled at a sampling frequency fs and a decimated data string is generated by decimating resulting digital data at a decimation ratio of 1/16;

FIG. 2 is a block diagram showing the configuration of a sampling device according to an embodiment of the invention;

FIG. 5 is a time chart for explanation of quadrature demodulation using the data distribution operation performed in the sampling device of FIG. 2; and FIG. 6 is a table illustrating a judgment and an oscillator control that are performed by a signal processor of the sampling device of FIG. 2.

DESCRIPTION OF THE PREFERRED EMBODIMENTS

Figure 3A:
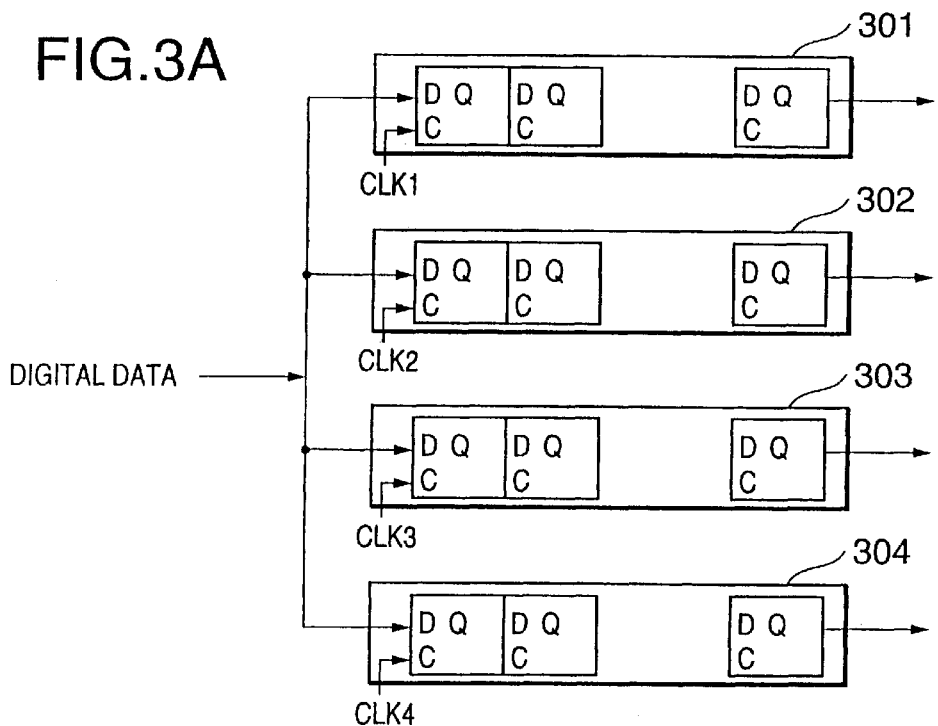
FIG. 3A is a block diagram showing an example of a distribution section of the sampling device of FIG. 2.

Before making a specific description, the principle of the present invention will be described with reference to FIGS. 1A–1D.

Referring to FIG. 1A, an analog input signal is sampled by using a sampling clock signal whose frequency is two or more times the frequency fIF of the analog input signal. In this case, the frequency of digital data obtained by the sampling is the same as the input signal frequency fIF.

Referring to FIG. 1B, the analog input signal having the frequency fIF is sampled at a sampling frequency fs and a decimated data string is generated by decimating resulting digital data at a decimation ratio of 1/4. In this case, there occurs the same undersampling effect as would occur when sampling is made at a sampling frequency fs1 (fs1=fs/4) that is lower than the Nyquist frequency. Therefore, the decimated data string has a frequency fIF1 that is lower than the input signal frequency fIF.

Referring to FIG. 1C, the analog input signal having the frequency fIF is sampled at a sampling frequency fs and resulting digital data is decimated at a decimation ratio of 1/8. In this case, there occurs the same undersampling effect as would occur when sampling is made at a sampling frequency fs2 (fs2=fs/8) that is lower than the Nyquist frequency. Therefore, the decimated data string has an even lower frequency fIF2.

It is seen from FIGS. 1B and 1C that even with the same sampling frequency fs the frequency of an output digital signal, that is, a decimated data string, depends on the decimation ratio. This suggests that, conversely, for input signals having different frequencies the frequencies of generated data strings can be equalized by changing the decimation ratio.

Referring to FIG. 1D, the analog input signal having the frequency fIF is sampled at a sampling frequency fs and resulting digital data is decimated at a decimation ratio of 1/16. In this case, an apparent sampling frequency fs3 is as follows:

$$fs3=fs/16$$

Now, the following condition is set for the input signal frequency fIF, where m is an integer.

$$fIF=m \times fs3$$

In the example of FIG. 1D, m is equal to 6 and the frequency fIF3 of an output digital signal is 0, that is, the output digital signal is a baseband signal.

The above discussion is summarized as follows. The sampling frequency fs satisfies the Nyquist condition and hence is higher than two times the frequency fIF of an analog input signal. Even when undersampling has already been performed at a sampling frequency that is lower than two times the frequency fIF of the analog input signal, the above-described undersampling effect can be expected by decimating data thereafter. Further, it is possible to decrease the frequency of an output digital signal down to the baseband frequency.

The configuration of a sampling device according to an embodiment of the invention will be described below with reference to FIG. 2.

Referring to FIG. 2. the sampling device includes an analog filter 201, an A/D converter 202, an oscillator 203 and a signal processor 204. The analog filter 201 generates an analog filtered signal by limiting the bandwidth of a received analog input signal. The A/D converter 202 generates digital data by sampling the analog filtered signal according to a sampling clock signal. The oscillator 203 supplies the sampling clock signal to the A/D converter 202 under control of the signal processor 204.

The signal processor 204 includes a distribution section 205 for dividing digital data into N data strings (N is an integer), that is, distributing the digital data to the N data strings. The signal processor 204 further includes first to Nth processors 206–209 for generating N processed data strings by performing prescribed signal processing operations on the N respective data strings. By referring to the N processed data, a local processor 210 generates a processing result signal by executing a process described below. A next-stage signal processor 211 generates a digital output signal that represents a sound, light, a voice, fax data, LCD data, PC data, or the like based on the processing result signal. The local processor 210 also controls an oscillation frequency of the oscillator 203.

The signal processor 204 is formed by software by using a DSP (digital signal processor) or a CPU (central processing unit), a ROM (read-only memory), and a RAM (random access memory). The signal processor 204 can also be formed by using a logic circuit such as a gate array.

The operation of the above sampling device will be described below.

First, an analog input signal is bandwidth-limited by the analog filter 201 and is thereby converted to an analog filtered signal. The analog filter 201, which is one generally called an anti-aliasing filter, need to be provided upstream of the position where sampling is performed by the A/D converter 202. Then, the analog filtered signal is sampled by the A/D converter 202 by using a sampling clock signal having a sampling frequency fs that is generated by the oscillator 203, and is thereby converted to a digital signal. The digital signal thus generated is supplied to the signal processor 204. The sampling frequency fs is N times an A/D sampling frequency (fsi) that is necessary for conversion from the analog input signal to a digital output signal (N is an integer).

First, the distribution section 205 generates N data strings by sequentially distributing the digital signal to the N data strings. Or the distribution section 205 performs a distribution operation with data storage rather than in a sequential manner. At this time, the distribution section 205 does not always generate N data strings by using the entire digital data. For example, there may occur a case that only three data strings are taken out though N is equal to 16. Therefore, as for this operation, another expression "decimation at a ratio 1/N" is more frequently used than the expression "distribution to N data strings." The resulting N data strings, that is, decimated data strings, are processed by the first to Nth signal processors 206–209, respectively, and resulting N processed data strings are supplied to the local processor 210. The local processor 210 executes prescribed processes such as comparison, judgment, decision, and calculation on a combination of processed data strings, and supplies a processing result signal to the next stage signal processor 211.

Further, the local processor 210 controls the oscillator 203 by feeding back information of a phase deviation and a frequency deviation to it based on the N processed data strings. The next-stage signal processor 211, which is a known device, performs a control according to a signal format, decoding, audio reproduction, etc. and outputs, as a digital output signal, a sound, light, a voice, fax data. LCD data, PC data, or the like.

Figure 3B:
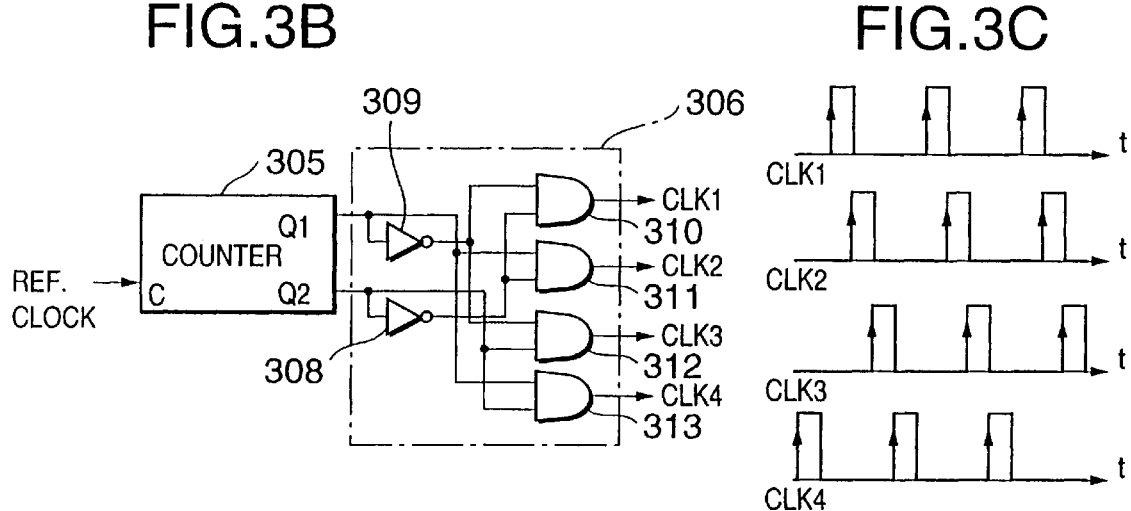
FIG. 3B is a block diagram showing an example of a distribution clock generator for use in the distribution section of FIG. 3A.
Figure 3C:
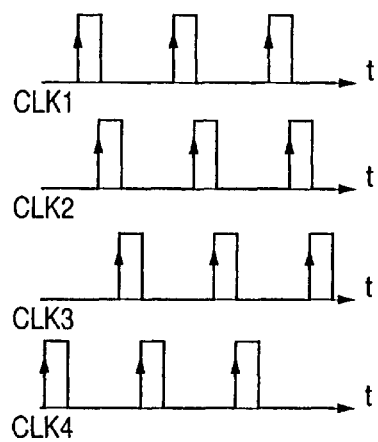
FIG. 3C is a time chart showing generation timing of distribution clock signals CLK1–CLK4 which are generated by the distribution clock generator of FIG. 3B.

Referring to FIGS. 3A–3C, the distribution section 205 will be described for an example in which it is formed by logic circuits and N is equal to 4.

As shown in FIG. 3A, the distribution section 205 includes first to fourth shift registers 301–304 that receive digital data from the A/D converter 202 and output respective data strings according to distribution clock signals CLK1–CLK4.

As shown in FIG. 3B, the distribution clock signals CLK1–CLK4 are generated by a combination of a logic circuit 306 and a counter 305 that receives a reference clock signal having a reference frequency (f0). For example, the logic circuit 306 is formed by inverter circuits 308 and 309 and AND circuits 310–313, or by NAND circuits, OR circuits, etc. The first to fourth shift registers 301–304 perform data reading operations at the leading edges of the respective distribution clock signals CLK1–CLK4.

The distribution clock signals CLK1–CLK4 are generated by the combination of the logic circuit 306 and the counter 305 as shown in FIG. 3C. The distribution clock signals CLK1–CLK4 are rectangular-wave signals that are delayed by 1/f0 in order and rise at intervals of 4/f0. The reference clock signal is generated by a section that is not shown in FIG. 2. The reference clock signal may be generated by using the sampling clock signal.

Figure 4:
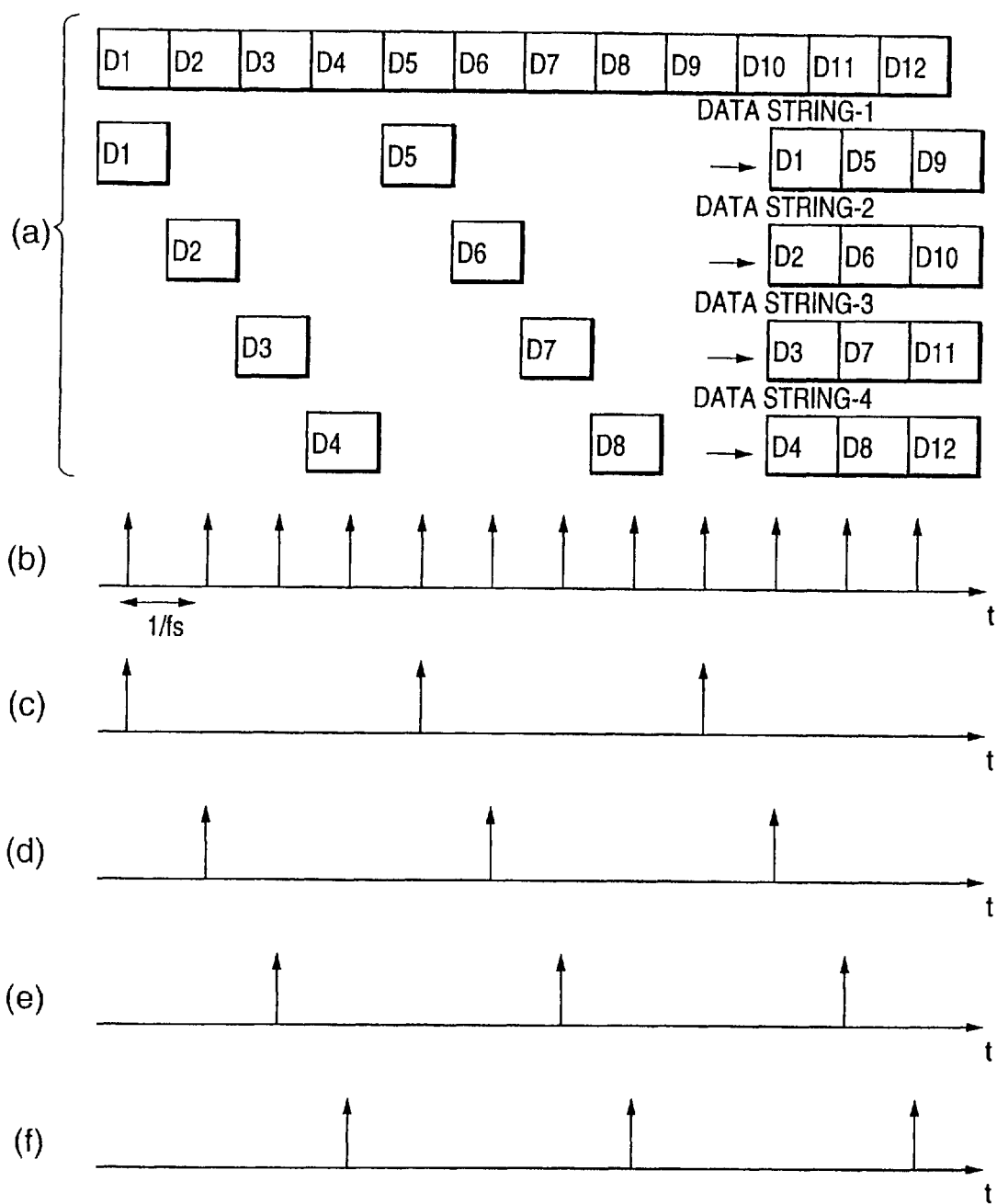
FIG. 4 is a timing chart showing a data distribution operation performed by the distribution section of FIG. 3A.

Referring to FIG. 4, a description will be made of how distribution to data strings is performed by the distribution section 205, for an example in which N is equal to 4. In FIG. 4(a), reference symbols D1–D12 denote time-series data (i.e., digital data) that are generated when the A/D converter 202 captures portions of an analog input signal at time points indicated by arrows that represent sampling clocks (see FIG. 4(b)). Arrows in FIGS. 4(c)–4(f) indicate timing of distribution of the digital data that is performed in the distribution section 205. That is, FIG. 4(c) shows timing of distribution of a data string D1–D12 (see FIG. 4(a)) to a data string-1. Data D1, D5, and D9 are distributed to the data string-1 at time points shown in FIG. 4(c). Similarly, the data are distributed to a data string-2, -3, and -4 at time points shown in FIGS. 4(d)–4(f), respectively. It is seen from FIG. 4(a) that the data of the data string-1 to the data string-4 have a timing relationship that they are delayed in order by 1/fs.

Referring to FIG. 5, a description will be made of the sampling clock signal and the decimation timing as well as quadrature demodulation for an example in which N is equal to 16. In general, the term "quadrature demodulation" means obtaining a baseband I signal and Q signal by multiplying an input signal by a sine signal and a cosine signal having the same frequency as the carrier wave of the input signal.

As shown in FIG. 1D, if digital data obtained by sampling an analog filtered signal at a sampling frequency fs by the A/D converter 202 is decimated by the distribution section 205 at a ratio of 1/N, a sampling frequency fs3 appears substantially, where $fs3=fs/N.$ In the case where the sampling frequency fs3 is so set as to be equal to an integral multiple of the input signal frequency fIF, the following relationship holds, where m is an integer.

$fIF=m \times fsi.$

In the example of FIG. 1D, m is equal to 6. In this case, because of the known undersampling effect, the frequency fIF3 of a digital signal obtained becomes a baseband frequency. Also in this case, N data strings that are delayed in order by 1/fs can bee obtained in the same manner as described above in connection with FIGS. 3A–3C.

Among the general equations of trigonometric functions is the following equation:

$\sin(\theta+\pi/2)=\cos \theta.$

By using this equation, I and Q signals can be generated from a plurality of signals having delays.

FIG. 5(a) shows sampling time points (arrows) in the A/D converter 202, and FIGS. 5(b)–5(e) show decimation time points (arrows) in a case where N is equal to 16. In this case, if the decimation time points of FIG. 5(b) are assumed to be sin θ, it can be said that the decimation time points of FIG. 5(c) that are delayed from the former by π/2 are represented by cos θ. Therefore, quadrature demodulation can be performed by using, as I and Q signals, data obtained with decimation timing of sin θ and cos θ.

Also for delay adjustments in quadrature detection of which sufficient care should be taken in synchronous detection or the like, it is possible to perform simultaneous, parallel signal processing on data that are delayed by ±1/fs as shown in FIGS. 5(d) and 5(e) from data having the decimation time points as shown in FIG. 5(b) and to immediately compare and examine those data.

Next, referring to FIG. 6 in addition to FIGS. 2 and 4, a description will be made of the judgment and the control on the oscillator 203 that are performed in the signal processor 204.

It can be considered that for a data string-1 to a data string-16 having different delays, relationships between reception signals and phases of the oscillator are slightly different from each other. The local processor 210 compare magnitudes of power, error rates, etc, of respective data strings as subjected to the signal processing operations in the first to Nth processors 206–209 and selects a data string having the largest power or the smallest error rate. Selected data strings are circled in FIG. 6.

The local processor 210 can perform delay adjustments through signal processing without controlling the oscillator 203 by passing processed data having the smallest error rate to the next stage signal processor 211, or combining several data having good characteristics by performing a calculation thereon and passing combined data to the next-stage signal processor 211.

A description will be made of a device that is so designed that a state that the data string-8 has the smallest error rate is proper. In this case, the fact that the data string-7 has the best characteristic at a certain time point (e.g., t=1) indicates a "phase deviation of 1." Further, the fact that the proper data string varies in a prescribed period indicates a temporal phase variation, that is, a frequency deviation as shown in FIG. 6. Based on those pieces of information, the local processor 210 can perform adjustments to the oscillator frequency that are important in mobile communication terminals that perform transmission, as well as phase deviation adjustments that are particularly important in synchronous detection by controlling oscillator 203.

As described above, the invention can provide a data sampling method and device which make it possible, with a simple configuration, to give a prescribed frequency to output signals even if input signals have different frequencies.

What is claimed is:

1. A data sampling method for an A/D (analog-to-digital) conversion from an analog input signal to a digital output signal, comprising the steps of:
   a) converting the analog input signal to digital data by sampling the analog input signal at a sampling frequency fs that is N times an A/D sampling frequency that is necessary for the A/D conversion, where N is an integer;
   b) decimating the digital data at a ratio of 1/N to produce N decimated data strings; and
   c) selecting the digital output signal from among the N decimated data strings.

2. The data sampling method according to claim 1, further comprising the step of
   d) adjusting the sampling frequency fs based on the N decimated data strings.

3. The data sampling method according to claim 2, wherein the step d) comprises the steps of:

d-1) selecting a decimated data string from the N decimated data strings by comparing data error rates thereof; and d-2) adjusting the sampling frequency fs depending on a deviation of a selected decimated data string from a predetermined data string of the N decimated data strings.

4. The data sampling method according to claim 1, wherein the step c) comprises the steps of:

c-1) selecting at least one decimated data string from the N decimated data strings depending on data error rates thereof, wherein a data error rate of a selected decimated data string is relatively small; and c-2) producing the digital output signal from the selected decimated data string.

5. The data sampling method according to claim 1, wherein the step b) comprises the steps of:

b-1) generating N clock signals which have 1/N the sampling frequency fs and are delayed in order by 1/fs; and b-2) distributing the digital data using the N clock signals to produce the N decimated data strings.

6. The data sampling method according to claim 1, wherein a value of N is determined depending on a frequency of the analog input signal.

7. The data sampling method according to claim 1, wherein a frequency of each of the N decimated data strings is set to a baseband frequency so as to demodulating the analog input signal.

8. A data sampling method for an A/D (analog-to-digital) conversion from an analog input signal to a digital output signal, wherein the analog input signal has been modulated according a predetermined quadrature modulation scheme, comprising the steps of:

a) converting the analog input signal to digital data by sampling the analog input signal at a sampling frequency fs that is N times an A/D sampling frequency that is necessary for the A/D conversion, where N is an integer and is determined depending on a frequency of the analog input signal;

b) generating N clock signals which have 1/N the sampling frequency fs and are delayed in order by 1/fs;

c) decimating the digital data using two clock signals selected from the N clock signals to produce two decimated data strings, wherein a frequency of each of the N decimated data strings is set to a baseband frequency and one of the two clock signals is delayed from the other by $\pi/2$; and d) combining the two decimated data strings to produce the digital output signal as a quadrature-demodulated signal.

9. The data sampling method according to claim 8, further comprising the step of e) adjusting the sampling frequency fs based on the N decimated data strings.

10. The data sampling method according to claim 9, wherein the step e) comprises the steps of:

e-1) selecting a decimated data string from the N decimated data strings by comparing data error rates thereof; and e-2) adjusting the sampling frequency fs depending on a deviation of a selected decimated data string from a predetermined data string of the N decimated data strings.

11. The data sampling method according to claim 8, wherein the step d) comprises the steps of:

d-1) selecting at least one decimated data string from the N decimated data strings depending on data error rates thereof, wherein a data error rate of a selected decimated data string is relatively small; and d-2) producing the digital output signal from the selected decimated data string.

12. A data sampling device for an A/D (analog-to-digital) conversion from an analog input signal to a digital output signal, comprising:

an oscillator for generating a sampling frequency fs that is N times an A/D sampling frequency that is necessary for the A/D conversion, where N is an integer;

a converter for converting the analog input signal to digital data by sampling the analog input signal at the sampling frequency fs;

a decimator for decimating the digital data at a ratio of 1/N to produce N decimated data strings; and a combiner for selecting the digital output signal from among the N decimated data strings.

13. The data sampling device according to claim 12, further comprising:

a controller controlling the oscillator so adjust the sampling frequency fs based on the N decimated data strings.

14. The data sampling device according to claim 13, wherein the controller selects a decimated data string from the N decimated data strings by comparing data error rates thereof, and adjusts the sampling frequency fs depending on a deviation of a selected decimated data string from a predetermined data string of the N decimated data strings.

15. The data sampling device according to claim 12, wherein the decimator comprises:

a clock generator for generating N clock signals which have 1/N the sampling frequency fs and are delayed in order by 1/fs; and a distributor for distributing the digital data using the N clock signals to produce the N decimated data strings.

16. A data sampling device for an A/D (analog-to-digital) conversion from an analog input signal to a digital output signal, wherein the analog input signal has been modulated according a predetermined quadrature modulation scheme, comprising the steps of:

an oscillator for generating a sampling frequency fs that is N times an A/D sampling frequency that is necessary for the A/D conversion, where N is an integer and is determined depending on a frequency of the analog input signal;

a converter for converting the analog input signal to digital data by sampling the analog input signal at the sampling frequency fs;

a clock generator for generating N clock signals which have 1/N the sampling frequency fs and are delayed in order by 1/fs;

a demodulator for demodulating the digital data using two clock signals selected from the N clock signals to produce two decimated data strings, wherein a frequency of each of the N decimated data strings is set to a baseband frequency and one of the two clock signals is delayed from the other by $\pi/2$; and a combiner for combining the two decimated data strings to produce the digital output signal as a quadrature-demodulated signal.

* * * * *